United States Patent

Sato et al.

[11] Patent Number: 5,156,979
[45] Date of Patent: Oct. 20, 1992

[54] SEMICONDUCTOR-BASED RADIATION-DETECTOR ELEMENT

[75] Inventors: Noritada Sato; Toshikazu Suzuki; Osamu Ishiwata, all of Kawasaki, Japan

[73] Assignee: Fuji Electric Co., Ltd., Kawasaki, Japan

[21] Appl. No.: 664,825

[22] Filed: May 7, 1991

Related U.S. Application Data

[60] Division of Ser. No. 282,612, Dec. 12, 1988, Pat. No. 5,019,866, which is a continuation of Ser. No. 3,582, Jan. 15, 1987, abandoned.

[30] Foreign Application Priority Data

Jan. 21, 1986 [JP] Japan ................... 61-10629

[51] Int. Cl.$^5$ ............ H01L 31/15; H01L 21/44
[52] U.S. Cl. .................. 437/3; 437/24; 437/175
[58] Field of Search ........... 437/3, 20, 23, 24, 929; 357/9, 15, 17, 29; 148/DIG. 95, DIG. 128; 372/44, 46; 376/147

[56] References Cited

U.S. PATENT DOCUMENTS

| H. 147 | 11/1986 | Feldman et al. | 372/46 |
|---|---|---|---|
| 3,227,876 | 1/1966 | Ross. | |
| 3,668,065 | 6/1972 | Moir et al. | 376/147 |
| 4,419,578 | 12/1983 | Kress | 357/15 |
| 4,688,067 | 8/1987 | Rehak et al. | 357/29 |
| 4,692,782 | 9/1987 | Seki et al. | 357/29 |
| 4,746,484 | 5/1988 | Jassby | 376/147 |
| 4,896,200 | 1/1990 | Seki et al. | 357/2 |

Primary Examiner—Olik Chaudhuri
Assistant Examiner—Loc Q. Trinh
Attorney, Agent, or Firm—Spencer, Frank & Schneider

[57] ABSTRACT

A semiconductor-based radiation-detector element particularly adapted to neutron detection, and the method for making the same, in which a high sensitivity single-crystal semiconductor substrate has diffused therein at-least-one region of $^3$He gas, which remain resident therein, whereby, upon application of an inverse bias to the junction in the semiconductor substrate, the colliding of incident neutrons with the resident $^3$He gas results in a reaction which produces hole-electron pairs in the depletion layer within the semiconductor, those hole-electron pairs producing output electrical pulses which appear at the output terminals of the detector for utilization by detection and measuring apparatus connected to the semiconductor-based radiation-detector element.

7 Claims, 2 Drawing Sheets

SEMICONDUCTOR-BASED RADIATION-DETECTOR ELEMENT

This is a division of copending application Ser. No. 07/282,612 filed Dec. 12, 1988, now U.S. Pat. No. 5,019,866, which is a continuation of application Ser. No. 07/003,582 filed Jan. 15, 1987 (now abandoned).

BACKGROUND OF THE INVENTION

1. Field of the Invention

This invention relates to radiation detectors and, more specifically, to such detectors which are based on semiconductor principles.

2. Prior Art

Semiconductor-based radiation detectors generally have a single-crystal substrate with a p-n junction or a Schottky junction with an inverse bias applied to the depletion layer which occurs at the junction. When radiation strikes the depletion layer such radiation is detected by detecting the increase in electron-hole pairs which occurs in the region where the radiation is incident. This technique is effective in detecting radiation of the $\alpha$, $\beta$, $\nu$, and/or x-ray types.

When it comes to detecting neutrons, which by definition have no charge, there is no electrostatic influence on the Coulomb fields of the orbital electrons and atomic nuclei so the electron-hole pairs relied upon in the conventional semiconductor-based radiation detector do not appear as a result of incident neutron bombardment. Thus, the conventional semiconductor-based radiation detector cannot be used to detect neutrons. With this problem in mind, neutron detection has been approached from the standpoint of detecting charged particles produced by the reaction between the incident neutrons and the atomic nuclei. Such reaction produces free protons as a result of elastic scattering and nuclear fission. A prior art neutron detector based on this principle is shown in FIG. 1. In FIG. 1, a single-crystal silicon substrate detector-element 10 is housed in a sealing vessel 12 comprising a vessel body 14 and a cover 16, the purpose of which is to produce an hermetic seal of the vessel. Lead wire 18 is led out from one surface of semiconductor-based detector element 10 and through hermetic packing element 20. In the embodiment of FIG. 1, showing the prior art, the remaining lead wire 22 is grounded to the vessel body 14 which is metallic and, therefore, electrically conductive in character. The lead wire 18 is coupled to an indicating device, not shown, for indicating the presence and level of neutron incidence. A pipe 24 is hermetically sealed in cover 16. In operation, $^3$He is introduced into vessel 12 by way of pipe 24 from a source of such gas, not shown. This type of semiconductor-based neutron detector relies upon the reaction and the elastic scattering which result with respect to $^3$He and the incident neutrons, according to the following equation

$$^3\text{He} + n \rightarrow {}^3\text{He} + P + 765 \text{ KeV} \tag{1}$$

Where P is Protons. It can be seen from that equation that the incidence of neutrons on the $^3$He produces $^3$He + protons and a nuclear energy of 765 KeV. More specifically equation (1) shows that the incidence of neutrons on a $^3$He produces $^3$He and the following components: (1) reaction-generated nuclear energy to which an electron kinetic energy of 765 KeV is ascribed when the neutrons are reactive, (2) the reaction generated nuclear energy caused by the thermoneutron background, and, (3) protons produced by the elastic scattering caused by the incidence of neutrons upon $^3$He.

In the detector of FIG. 1, however, charged particles generated in the $^3$He gas must pass through the gas in order to reach the detecting element and, hence, the detection efficiency is decreased. The resolving power of the detector and its associated indicating equipment is consequently limited. Further, the vessel 12 must be very strong because the $^3$He gas is introduced into the vessel at a pressure of 1 to 5 atmospheres. Further, the detector of FIG. 1 requires various ancillary equipment, such as pipes for introducing the $^3$He gas into vessel 12. It is also necessary to have a gas flow rate regulator. Thus the equipment of FIG. 1 is not portable nor is it easy to utilize other than in a laboratory.

Therefore, it is a primary object of the present invention to provide a compact, lightweight semiconductor-based radiation detector which is highly portable and still also highly effective in detecting neutrons.

SUMMARY OF THE INVENTION

There is provided by this invention a semiconductor-based radiation detector (more specifically a neutron detector) in which $^3$He is diffused into the semiconductor substrate, in advance, by a plasma doping method with the resulting semiconductor substrate producing electron-hole pairs upon the incidence of neutrons on the surface of the semiconductor substrate. The p-n junction of a single-crystal semiconductor substrate (basically a p-n junction diode structure) having an inverse bias applied to the junction to expand the depletion layer results in a semiconductor-based radiation detector that is capable of detecting neutrons relying upon the $^3$He (n, p) reaction.

BRIEF DESCRIPTION OF THE DRAWINGS

This invention can best be understood by reviewing the description which follows in conjunction with the drawings herein, in which.

DETAILED DESCRIPTION OF THE PREFERRED EMBODIMENTS

Figure 1:
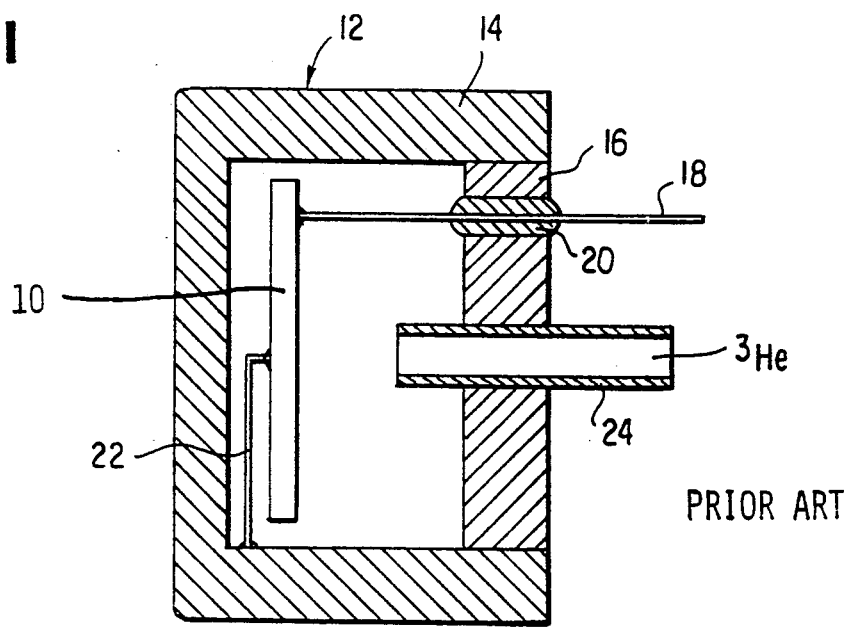
FIG. 1 is a mechanical schematic diagram, partially in cross-section showing a semiconductor-based radiation detector, according to the prior art.

FIG. 1 has been discussed in connection with the prior art and needs not to be discussed further herein.

Figure 2:
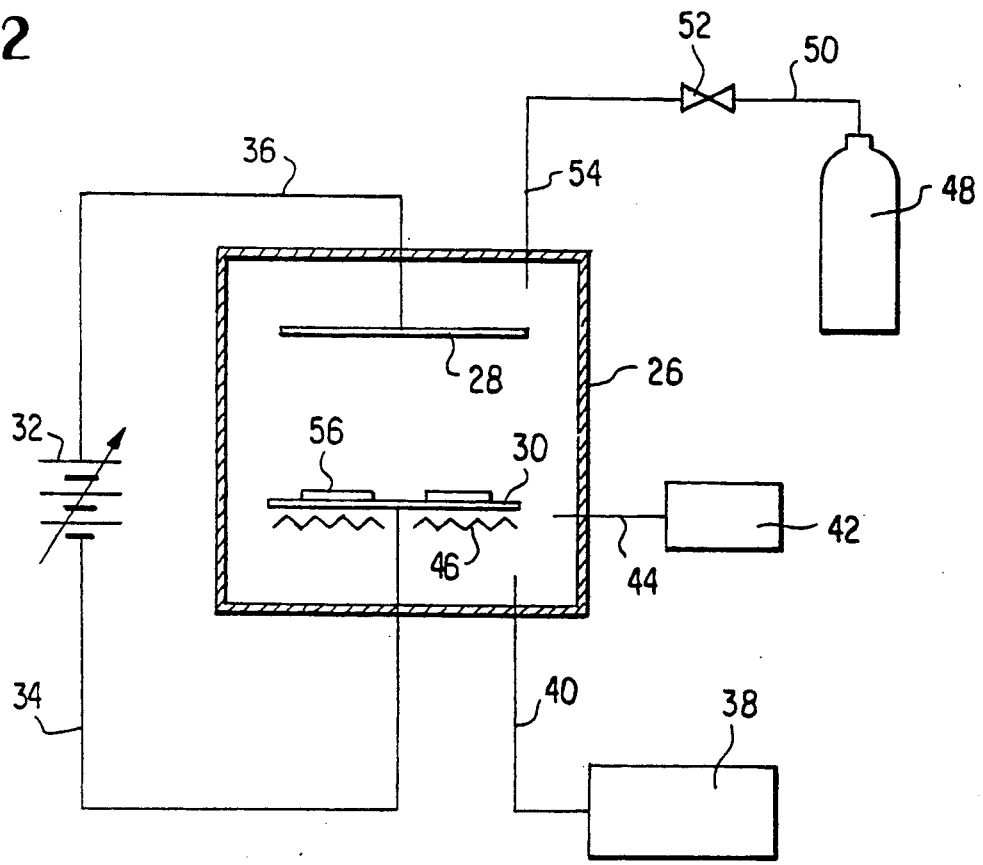
FIG. 2 is a schematic diagram of apparatus for diffusing $^3$He gas into a single-crystal silicon substrate.

As has been indicated in the Summary of the Invention, the radiation detecting element contemplated by this invention includes a single-crystal silicon substrate which has at least one layer of diffused $^3$He. To effect the diffusion of the $^3$He into the single-crystal silicon substrate, apparatus of the type shown in FIG. 2 may be used. This apparatus is more or less conventional plasma diffusion apparatus. In FIG. 2, reaction chamber 26, which is hermetically sealed, carries in its walls an upper electrode plate 28 and a lower electrode plate 30 which are opposed to each other. Appropriate potentials are applied to electrodes 28 and 30 from voltage source 32 by way of connectors 34 and 36 which pass through the walls of chamber 26 in a fashion so as to keep the hermetic sealing of chamber 26 intact. Electrodes 28 and 30 are supported from the walls of chamber 26. The internal pressure in chamber 26 is reduced by means of vacuum pump 38 which is coupled into chamber 26 by way of pipe 40, the passage of pipe 40 through the walls of chamber 26 being sealed, hermetically, to maintain the integrity of the chamber. The reduction in pressure within chamber 26 is measured by means of vacuum gage 42 which is intercoupled with the inner portion of chamber 26 by means of pipe 44, again hermetically sealed in the walls of chamber 26. A lower electrode 30 is heated by heater element 46 which is connected to a source of electricity, not shown. Tank or bottle 48 contains $^3$He gas which is coupled into reaction chamber 26 by way of pipes 50 and 54 and regulator 52.

A P-type single-crystal substrate 56, having a specific resistance of, for example, 10 K$\Omega$ cm or more is placed on lower electrode 30 and is heated to a temperature of, for example, 200 degrees C. by means of heater 46. At the same time, $^3$He gas is introduced from tank or bottle 48 into chamber 26 so that the pressure within reaction chamber 26, which had been previously reduced by exhaust system 38, arrives at, for instance, 4 Torr. A voltage, for example 550 volts DC, is applied between upper electrode plate 28 and lower electrode plate 30 from direct current source 32, thereby generating a plasma between the electrode plates 28 and 30. As a consequence, a significant amount of $^3$He is diffused into the surface of the single-crystal substrate 56 which rests on lower electrode 30. Such a low-temperature plasma doping method is fully disclosed in the Specification of Japanese patent laid-open publication numbers 218727, 218728/1984 in which the inventors are the same as the inventors of this invention.

Figure 3:
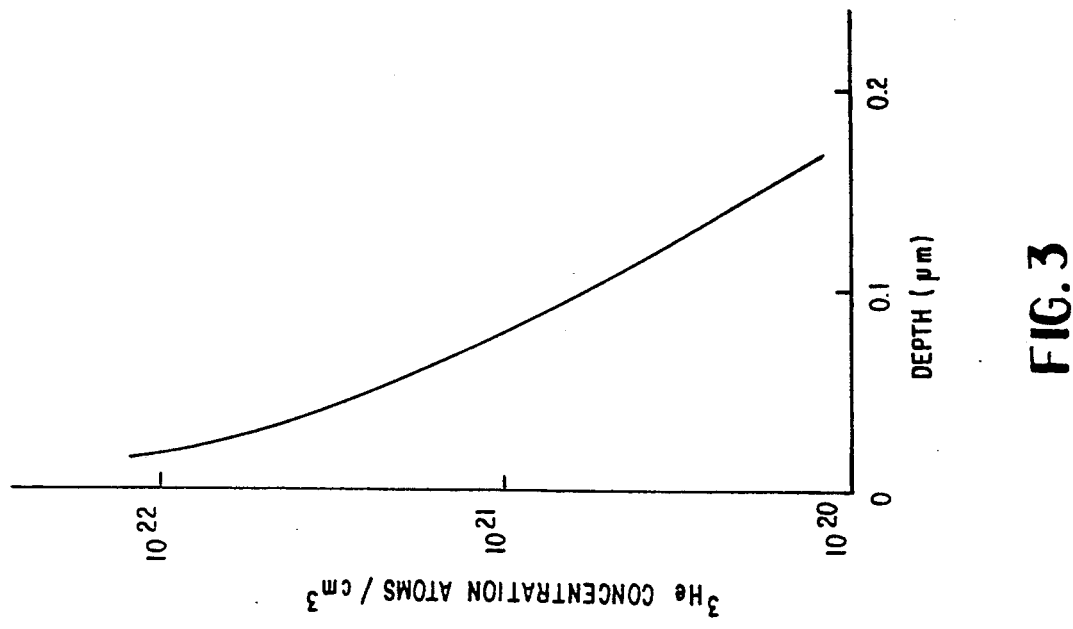
FIG. 3 is a graphical representation of the results produced by the apparatus of FIG. 2.

Turning to FIG. 3 there are shown the results which are obtained by the diffusion apparatus of FIG. 2. The data in FIG. 3 were obtained with the aid of a secondary ion mass analyzer (SIMS). The abscissa of the graph of FIG. 3 indicates the depth of diffusion into substrate 56 by the $^3$He atoms. The ordinate axis shows the concentration of $^3$He atoms within substrate 56. It is clear from the curve of FIG. 3 that $^3$He of $1 \times 10^{22}$ atom/cm$^3$ diffuses into the surface of single-crystal silicon substrate 56 and that $^3$He atoms continue to diffuse into the body of substrate 56. Thus, $^3$He may be said to be interstitially disposed in substrate 56. It is this diffusion of $^3$He into the substrate 56 that is relied upon to make the $^3$He-semiconductor-based radiation detector which is the subject of this invention. Specific embodiments of the semiconductor-based detector are shown in FIGS. 4 thru 8.

Figure 4:
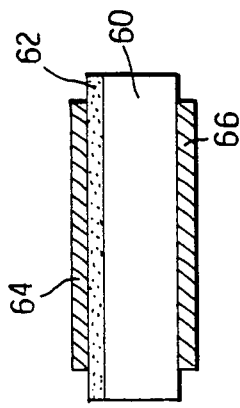
FIG. 4 is a schematic mechanical diagram, partially in section, of a Schottky-junction, semiconductor-based radiation detector element incorporating the present invention in its elemental form.

In FIG. 4, substrate 60 has a $^3$He-diffused region 62 adjacent to one of its surfaces. A metallic electrode 64 is deposited on the diffused region of substrate 60. An ohmic-contact electrode 66 is deposited on the opposite surface of substrate 60. When an inverse bias is applied between electrodes 64 and 66 a depletion layer forms in the region of the interface between electrode 64 and substrate 60. Any neutrons in radiant energy falling on the depletion layer react with the $^3$He of the diffused region 62 and produce the reaction set forth in equation (1). Tritons ($^3$H) and protons which are derived from the reaction cause electron-hole pairs to be produced in the depletion layer and these pairs are detected as pulses corresponding to incident neutrons. The embodiment of FIG. 4 is the simplest approach to the semiconductor-based radiation detector which is the subject of this invention.

Figure 5:
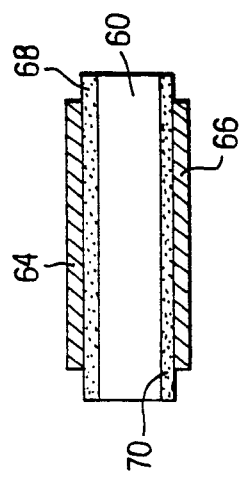
FIG. 5 shows an additional embodiment of the structure of FIG. 4, according to the present invention.

In FIG. 5, substrate 60 has $^3$He-diffused regions on both the upper and lower faces of substrate 60. These are regions 68 and 70. The technique for forming these diffused regions utilizes the apparatus of FIG. 2. Electrodes 64 and 66 are then applied to the opposite surfaces of substrate 60, as before, only in this case there are diffused regions on both sides of substrate 60. The use of the two diffused regions, one on each side including the side carrying the ohmic contact, permits the enhanced operation of this detector because additional tritons and protons can be generated with the larger diffused surface area.

Figure 6:
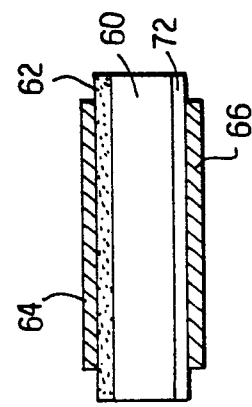
FIG. 6 shows an additional embodiment of the structure of FIG. 4, incorporating the present invention.

In FIG. 6 substrate 60 has a p$^+$ layer 72 in contact with ohmic contact 66. The p$^+$ region is produced by doping region 72 heavily with boron, utilizing the plasma doping equipment of FIG. 2. In FIG. 6 the lower $^3$He-diffused region 70 of FIG. 5 does not exist. The purpose of the structure of FIG. 6 is to get a very good ohmic contact with substrate 60 from ohmic contact 66. The other elements of FIG. 6 are the same as those shown in FIGS. 4 and 5.

Figure 7:
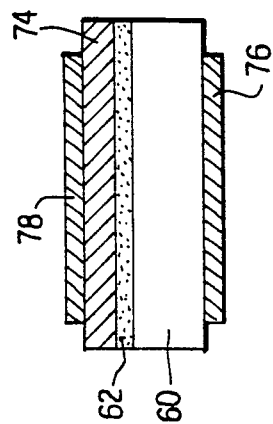
FIG. 7 is a schematic mechanical diagram, partially sectioned, showing an additional embodiment of the present invention; and, FIG. 8 is a schematic mechanical diagram, partially in section, of an additional embodiment of the structure of FIG. 7 utilizing the present invention.

In FIG. 7 substrate 60 has an amorphous silicon layer 74 formed thereon by means of the plasma CVD method utilizing monosilane gas. This amorphous silicon layer is laminated on top of $^3$He-diffused region 62. The substrate 60 is of the P-type having a specific resistance of more than 10K$\Omega$cm, thereby forming a heterojunction between the single-crystal silicon substrate 60 and the amorphous silicon layer 74. After the formation of the amorphous silicon region on the diffused region 62, ohmic electrodes 76 and 78 are applied to the combination. This may be achieved by the vacuum vapor-deposition method, an electron beam method or a sputtering method.

The requirements for achieving the plasma CVD deposition of the amorphous silicon layer 74 on the substrate 60 are as follows:

Gas for use: Hydrogen with 10% monosilane (SiH$_4$).
Pressure: 10 Torr.
Applied voltage: DC 800 volts.
Temperature of lower electrode plate: 200 degrees C.

Under these conditions an amorphous silicon layer 74 is formed having a thickness of approximately 1 $\mu$m.

Figure 8:
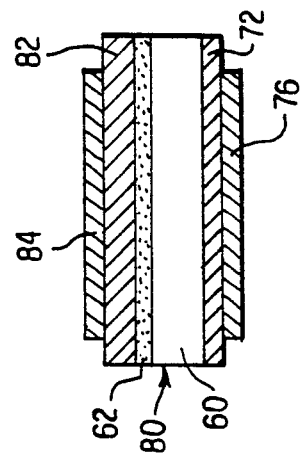

In FIG. 8, radiation detecting element 80 has a p$^+$ region 72 formed therein by doping the region with boron so as to assure a better ohmic contact to terminal 76. It is to be noted that, as in FIG. 6, there is no $^3$He-diffused region between substrate 60 and contact or terminal 76. There is a $^3$He-diffused region 62 formed on the opposite side of substrate 60 from p$^+$ region 72. That region 62 and the amorphous silicon layer 82, as well as ohmic contact or terminal 84, may be formed by the techniques and in the manner set forth in connection with the structure of FIG. 7. The detecting element of FIG. 8 exhibits a lower noise level than the structure of FIG. 7 and the temperature characteristics of the structure of FIG. 8 are superior to those of the structure of FIG. 7.

It is essential in connection with the doping of substrate 60, in all cases, that the plasma method described hereinbefore be used because it requires raising the temperature of the substrate minimally. If conventional techniques (which are applied in the manufacture of integrated circuits) are applied here, there may be a destruction of the single-crystal structure which is so essential to the proper performance of the radiation detector described herein. With the low temperature plasma diffusion technique described herein the temperature of the single-crystal substrate need not be raised beyond 200 degrees C. At such temperatures there is no degradation of the single-crystal nature of substrate 60.

It should be understood that while reference has been made repeatedly to single-crystal silicon as the substrate 60, the present invention is not confined to silicon but may involve crystal or compound semiconductors such as cadmium telluride and gallium arsenide. In the formation of the $^3$He-diffused region an ion implanting method may be used instead of the previously described plasma CVD method, with identical results being obtained. This latter method has the disadvantages of being expensive and time consuming.

The essence of the structure comprising the invention disclosed herein is the resident nature of the $^3$He gas in the semiconductor substrate and the method of getting it there. As a result of the resident nature of the $^3$He gas, external sources of gas are not required during the operation of the detector. Previous neutron detectors have required complex and heavy external equipment to support the operation of the detecting element itself. The detecting element according to this invention is stable and sensitive over a long period of time. Since the $^3$He-diffused region has a gas concentration of $10^{21}$ atoms/cm$^3$, on the average, the level of sensitivity of the detector is very high, which is important when it is being used as a neutron detector for protection of the human body. Experience indicates a lifespan of more than 10 years can be realized for the device according to the present invention.

While particular, embodiments of the present invention have been shown and described, it will be apparent to those ordinarily skilled in the art that variations and modifications may be made therein without departing from the true spirit and scope of the invention.

What is claimed is:

1. The method of fabricating a detecting element for a semiconductor-based radiation detector including the steps of:

providing a substrate of single-crystal silicon having first and second opposite surfaces;

diffusing a region of $^3$He into at least one of the first and second opposite surfaces of said substrate, said $^3$He region being formed by a low-temperature plasma CVD doping process;

depositing a metal on the first surface of said substrate, said metal making a rectifying connection to the first surface of said substrate; and depositing a metal on the second surface of said substrate, said metal making an ohmic connection to the second surface of said substrate.

2. The method according to claim 1 in which the temperature of said low temperature plasma CVD doping process is not greater than 200° C.

3. The method according to claim 1 in which a region of $^3$He is diffused into only one of the first and second surfaces of said substrate, said method including the additional step of forming a p+ region in the surface opposite the surface proximate to that in which said $^3$He region is formed, said p+ region being formed by diffusing boron into said substrate through said opposite surface.

4. The method of fabricating a detecting element for a radiation-based radiation detector which includes the steps of:

diffusing $^3$He into one surface of a single-crystal silicon substrate having opposing surfaces;

laminating amorphous silicon onto at least one of the opposite surfaces of said single-crystal silicon substrate to form a heterojunction with said single-crystal substrate using a low-temperature plasma method; and depositing by a vapor deposition step a first ohmic contact on said amorphous silicon and a second ohmic contact on the surface of said single-crystal substrate opposite that on which said amorphous silicon is laminated.

5. The method of fabricating a detecting element for a radiation-based radiation detector which includes the steps of:

providing a substrate of single-crystal silicon having first and second opposite surfaces;

diffusing a region of $^3$He into at least one of the first and second opposite surfaces of said substrate, said $^3$He region being formed by a low-temperature plasma CVD doping process;

laminating amorphous silicon onto at least one of the opposite surfaces of said single-crystal silicon substrate to form a heterojunction with said single-crystal substrate using a low-temperature plasma CVD method; and depositing by a vapor deposition step a first ohmic contact on said amorphous silicon and a second ohmic contact on the surface of said single-crystal substrate opposite that on which said amorphous silicon is laminated.

6. The method according to claim 5 wherein said amorphous silicon is laminated onto the surface into which said $^3$He is diffused.

7. The method according to claim 6 wherein a p+ region is interposed between said substrate and the second ohmic contact.

* * * * *